Figure 1A:
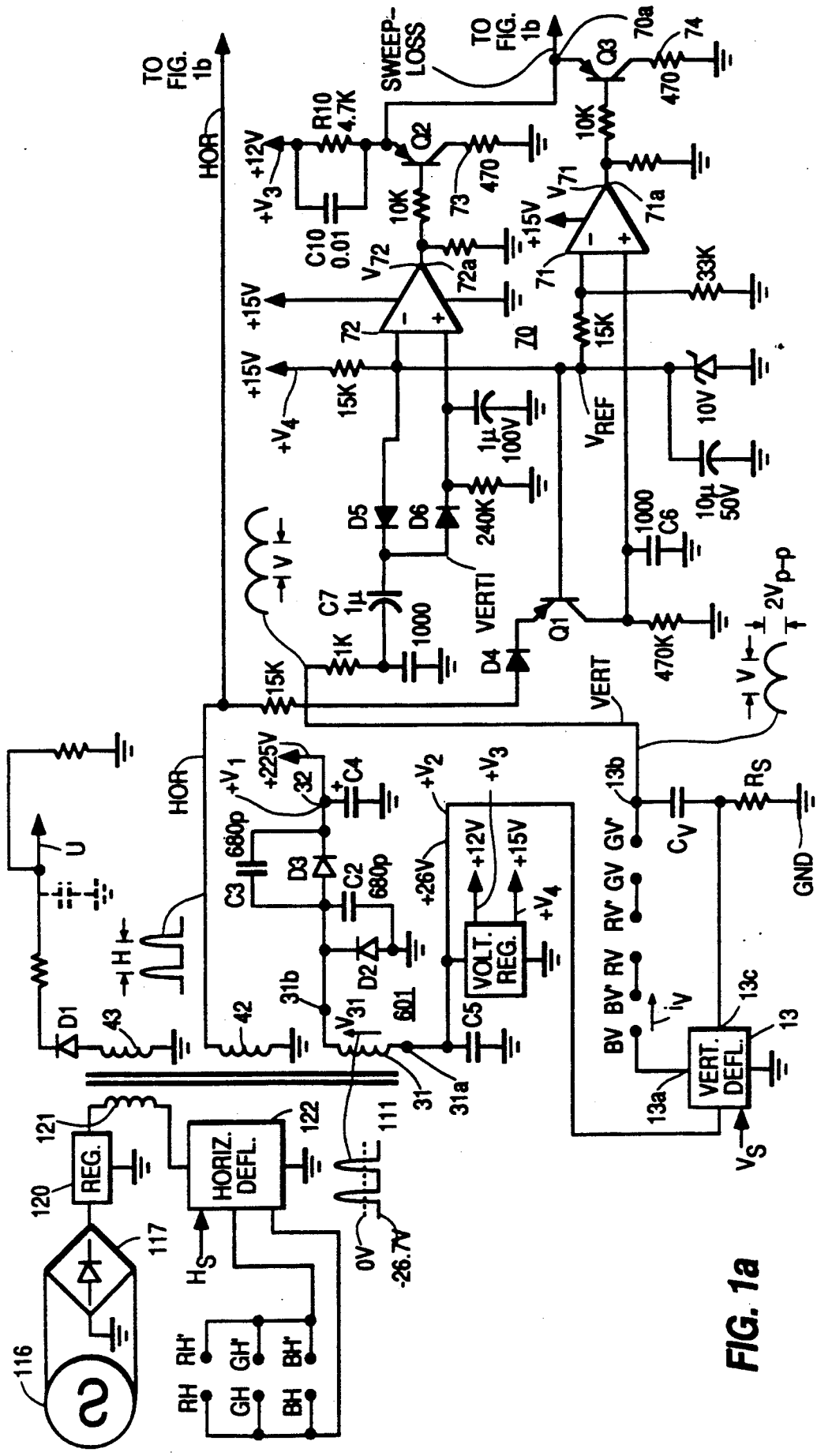

United States Patent [19]

Norman et al.

[11] Patent Number: 5,036,257
[45] Date of Patent: Jul. 30, 1991

[54] PROJECTION TV DEFLECTION LOSS PROTECTION CIRCUIT

[75] Inventors: Marvin N. Norman, Noblesville; Lawrence E. Smith; Peter R. Knight, both of Indianapolis, all of Ind.

[73] Assignee: Thomson Consumer Electronics, Inc., Indianapolis, Ind.

[21] Appl. No.: 516,385

[22] Filed: Apr. 30, 1990

[51] Int. Cl.$^5$ .................. G09G 1/04; H01J 29/52; H04N 5/30

[52] U.S. Cl. .................. 315/381; 315/384; 315/386; 358/220

[58] Field of Search ............ 315/381, 384, 386, 411; 358/243, 220

[56] References Cited

U.S. PATENT DOCUMENTS

| | | | |
|---|---|---|---|
| 3,535,445 | 10/1970 | Griffery | 315/381 |
| 3,784,870 | 1/1974 | Dorsey | 315/381 |
| 3,810,024 | 5/1974 | Meacham | 328/8 |
| 3,963,961 | 6/1976 | Ray et al. | 315/381 |
| 4,056,758 | 11/1977 | Schaas | 315/381 |
| 4,198,661 | 4/1980 | Gatten et al. | 358/242 |
| 4,275,338 | 6/1981 | Grocki et al. | 315/381 |
| 4,297,619 | 10/1981 | Kiteley | 315/381 |
| 4,340,910 | 7/1982 | Valdes | 358/243 |
| 4,390,817 | 6/1983 | Johnson | 315/384 |
| 4,404,500 | 9/1983 | Stow | 315/386 |
| 4,458,181 | 12/1984 | Haferl | 358/220 |
| 4,521,720 | 6/1985 | Griffey | 315/386 |
| 4,642,532 | 2/1987 | Hoover | 315/386 |
| 4,660,093 | 4/1987 | Craig | 358/243 |
| 4,677,351 | 6/1987 | Brust et al. | 315/386 |
| 4,763,046 | 8/1988 | Sheikholeslami et al. | 315/381 |

OTHER PUBLICATIONS

Pp. 1 and 2 of Schematic Diagram entitled REAR Projection CRT Board, dated Mar. 25, 1988 and Jan. 12, 1989.
U.S. Patent Application Ser. No. 07/516,386 entitled A Self Biasing Protection Arrangement for a Cathode Ray Tube, in the name of John Barrett George.
U.S. Patent Application Ser. No. 07/515,513 entitled A Protection Circuit for a Cathode Ray Tube, in the name of John Barrett George.
Schematic diagram for PV-140/Digital (G) Zenith rear proj. color digital TV receiver, reprinted in Profax, May 1990.
U.S. Patent Application Ser. No. 07/515,499 entitled A Deflection Loss Protection Arrangement for a CRT, in the names of Leroy Samuel Wignot and Lawrence Edward Smith.
U.S. Patent Application Ser. No. 07/515,512 entitled Video Display Apparatus with Kinescope Spot Burn Protection Circuit, in the names of Thomas David Gurley and Leroy Samuel Wignot.

Primary Examiner—Gregory C. Issing
Attorney, Agent, or Firm—Joseph S. Tripoli; Joseph J. Laks; Sammy S. Henig

[57] ABSTRACT

A voltage at a control grid of a cathode ray tube is generated at a blanking level to provide beam current blanking when horizontal deflection loss occurs. The control grid voltage at the blanking level is developed in a capacitor prior to an instant in which the horizontal deflection loss occurs. When the capacitor voltage is applied to the control grid to provide the blanking level, the capacitor is discharged slowly. To maintain the capacitor charged, prior to such instant when horizontal deflection is lost, the capacitor voltage is not applied to the control grid as long as the horizontal deflection is normal, regardless of whether vertical deflection loss occurs. Either horizontal deflection loss or vertical deflection loss will disable a video driver stage that controls the cathode of the cathode ray tube for providing additional beam current blanking capability.

7 Claims, 2 Drawing Sheets

PROJECTION TV DEFLECTION LOSS PROTECTION CIRCUIT

This invention relates to video display apparatus, and in particular, to projection-type video display apparatus having multiple cathode ray tubes and, even more particularly, to cathode ray tube (CRT) protection circuits operating in response to deflection loss.

Projection video display apparatus, such as television receivers, normally include three monochrome cathode ray tubes individually producing red, green and blue images. A magnifying lens assembly typically is mounted to each of the cathode ray tubes and transmits light from the tubes to one or more mirrors where the light is reflected onto a viewing area of a projection screen, for rear projection-type receivers. The screen transmits some of the light so that an enlarged image formed from the superimposed images from each of the cathode ray tubes is viewable from a position in front of the screen. The screen acts to diffuse the light from the tubes somewhat to increase the audience viewing angle in order to enlarge the acceptable viewing region about the front of the screen.

In order to form a final enlarged image of sufficient brightness that viewing is acceptable under normal room lighting, it is necessary that the individual cathode ray tube be operated at high brightness levels, corresponding to high levels of electron beam current density. Loss or reduction of horizontal or vertical deflection or scan of any or all of the cathode ray tube electron beams will cause an undesirable concentration of electron beam energy over a small region of the phosphor display screen of one or more of the cathode ray tubes. This may cause permanent damage to the display screen if the scan loss or reduction condition persists for even a short time, and particularly when horizontal scan loss occurs and a vertical line or spot (no vertical or horizontal deflection) appears on the CRT screen. It is therefore important that some form of protection circuit be provided that quickly senses a loss or reduction of electron beam deflection and responds in an appropriate manner, such as by blanking the electron beam or beams, to prevent damage to the cathode ray tubes.

U.S. Pat. No. 4,642,532 to Hoover discloses a projection TV deflection loss protection circuit wherein signals representative of vertical and horizontal deflection currents are sensed. In the event of a loss of either of the horizontal or vertical deflection signal, a signal is generated to disable the kine driver circuits and therefore to blank out the CRT screen.

It may be desirable to provide a protection circuit which will protect the CRT screen from phosphor burn when deflection loss occurs even when one or more of the video drive circuits or amplifiers short, for example a collector to emitter short, in which case the CRT cathode may be very close to ground level and to the grid voltage.

It may be desirable to provide a CRT protection circuit which offers redundant CRT protection should a horizontal sweep-loss occur.

In a circuit embodying an aspect of the invention, the kine driver circuits are disabled and therefore blank out the beam current in the event of a loss of either the horizontal or vertical deflection current. Additionally, the circuit includes a capacitor that is maintained charged as long as horizontal deflection is produced. When horizontal deflection loss occurs, a negative voltage that is developed in the capacitor is coupled to the control grid of the CRT and the capacitor begins discharging slowly. The negative voltage that is in the order of 200 volts insures beam current blanking regardless of whether or not the kine drive circuits are already disabled. In this way, fault protection redundancy is provided. Advantageously, the capacitor is maintained charged as long as horizontal deflection is produced such that a loss of only vertical deflection but not of horizontal deflection will not cause the capacitor to discharge. Therefore, when a user turns off the receiver and the horizontal deflection is then lost, the capacitor voltage will provide beam current blanking to protect against screen burn. Such protection is provided even if prior to turning off the receiver the vertical deflection has already been lost as a result of a fault condition. This is so because vertical deflection loss, advantageously, does not cause the capacitor voltage to discharge.

A video display apparatus, embodying an aspect of the invention, includes a cathode ray tube having a cathode electrode, a control grid electrode and a high voltage electrode. A source of a high voltage is coupled to the high voltage electrode of the cathode ray tube for producing a beam current that flows in the cathode electrode. A horizontal deflection current is generated in a horizontal deflection winding. A vertical deflection current is generated in a vertical deflection winding. A first signal that is indicative of normal operation of the horizontal deflection current and of a fault condition of the horizontal deflection current is generated. A second signal that is indicative of normal operation of the vertical deflection current and of a fault condition of the vertical deflection current is generated. A video amplifier responsive to the first and second signals and coupled to the cathode electrode generates a cathode electrode voltage at the cathode electrode such that when neither one of the first and second signals is indicative of such fault condition, the video amplifier operates in a normal mode of operation and when any one of the first and second signals is indicative of such fault condition the video amplifier operates in a second mode of operation. A grid electrode voltage at the grid electrode is generated in an arrangement. As long as the first signal is indicative of normal operation of the horizontal deflection current, regardless of any fault in the vertical deflection current, the grid electrode voltage generating arrangement operates in a normal mode of operation. When the first signal is indicative of the fault in the horizontal deflection current, the grid electrode voltage generating arrangement operates in a second mode of operation.

Figure 1B:
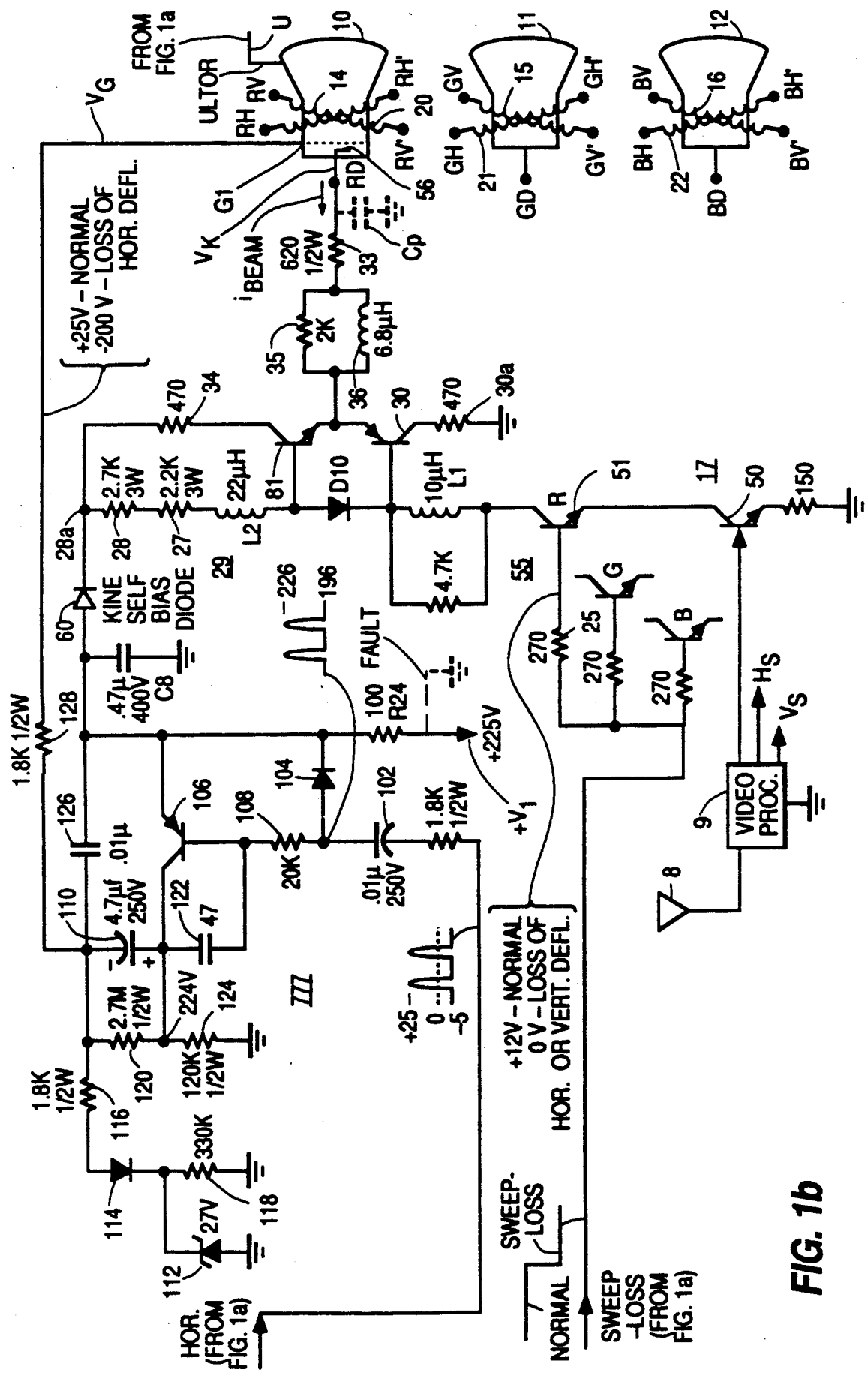

FIGS. 1a and 1b illustrate a block and schematic diagram of a portion of a projection-type video display apparatus incorporating a protection circuit embodying aspects of the invention.

Referring to the FIGS. 1a and 1b, a projection-type video display apparatus, such as a television receiver, incorporates three monochrome CRT's or kinescopes 10, 11 and 12. Kinescope 10 illustratively produces red images, kinescope 11 produces green images, and kinescope 12 produces blue images. The three images are combined by an optical system onto a viewing screen to be displayed to the user.

Vertical deflection windings 14, 15 and 16 that are coupled between terminals RV—RV', GV—GV' and BV—BV', respectively, are coupled in series between an output terminal 13a of a vertical deflection circuit 13 and a terminal 13b. A DC blocking capacitor $C_V$ and a current sampling resistor RS are coupled in series with windings 14, 15 and 16, between terminal 13a and ground. Circuit 13 produces a sawtooth vertical deflection current $i_V$ that flows in capacitor $C_V$ to produce a vertical rate signal VERT at terminal 13b that includes a parabolic voltage component during normal operation. Should a vertical scan loss occur, for example, when any one of windings 14, 15 and 16 is an open circuit, parabolic signal VERT will not be generated.

A line rate, or horizontal deflection circuit 122 generates horizontal drive signals at terminal RH—RH', GH—GH' and BH—BH', which are applied to and produce horizontal deflection currents in horizontal deflection windings 20, 21 and 22, respectively. Horizontal deflection circuit 122 is coupled to a primary winding 121 of a flyback or high voltage transformer 111. High voltage transformer 111 includes a load circuit supply winding 31 which, via a diode D3 of a rectifying stage, produces a voltage level $+V_1$ at a terminal 32. Voltage level $+V_1$ may illustratively be of the order of +225 volts. Voltage level $+V_1$ is DC-coupled to the cathodes of CRT's 10, 11 and 12, as described later on.

During the trace interval of a deflection cycle, a trace voltage $V_{31}$ is developed across winding 31 of flyback transformer 11, in a well known manner. Trace voltage $V_{31}$ is, for example, −28 volts. A diode D2 that is poled to be conductive during trace is coupled between a terminal 31b of winding 31 and a common conductor or ground. Diode D2 couples trace voltage $V_{31}$ across a filter capacitor C5 for developing a positive voltage level $+V_2$ across capacitor C5 at a terminal 31a of winding 31 that energizes vertical deflection circuit 13. Voltage level $+V_2$ is approximately +26 volts.

High voltage transformer 11 also includes a winding 42 for developing a retrace pulse signal HOR at the horizontal line rate during normal operation of horizontal deflection circuit 122. Should a horizontal deflection loss occur, it is assumed that signal HOR will not be generated.

The high voltage transformer 11 also includes a winding 43 for producing the high voltage or ultor voltage for the cathode ray tube anode. Diode D1 is provided to rectify the ultor voltage. The ultor voltage is also typically provided to a focus anode of the CRT via a voltage divider circuit, not shown, for focus control and also may be provided to the CRT screen grids via a divider.

Vertical parabola signal VERT is AC coupled via capacitor C7 to a cathode of a diode D5 of a fault detector 70. Diode D5 has an anode that is coupled to a DC voltage $V_{REF}$. Consequently, a parabolic voltage VERT1 that is clamped approximately to the level of voltage $V_{REF}$ is developed at the cathode of diode D5. Voltage VERT1 is coupled via a peak rectifier that includes a diode D6 to a noninverting input terminal of a comparator 72. An inverting input terminal of amplifier 72 is coupled to voltage $V_{REF}$. When signal VERT is at normal operating level, indicating normal vertical deflection, an output voltage $V_{72}$ of comparator 72 is approximately 12 volts. When vertical deflection fails, output voltage $V_{72}$ becomes approximately zero volts.

Signal HOR that is indicative of normal horizontal scanning is coupled via a rectifying diode D4 to the emitter of a transistor Q1 of fault detector 70. A capacitor C6 is coupled to the collector of transistor Q1 and to a noninverting input terminal of a comparator 71. The inverting input terminal of comparator 71 is coupled to reference voltage $V_{REF}$ through a voltage divider.

When signal HOR is produced, indicating normal horizontal scanning, an output voltage $V_{71}$ developed at an output terminal 71a of comparator 71 is greater than approximately +12 volts. On the other hand, when signal HOR is missing, and is indicative of a loss of horizontal scanning, voltage $V_{71}$ is approximately zero volts.

Voltages $V_{71}$ and $V_{72}$ are coupled to the bases of a pair of transistors Q2 and Q3, respectively. The emitters of transistors Q2 and Q3 are coupled together at a junction terminal 70a. Terminal 70a is coupled via a resistor R10 in parallel with a bypass capacitor C10 to a voltage level $+V_3$ that is illustratively +12 volts. The collectors of transistors Q2 and Q3 are coupled to ground through corresponding resistors 73 and 74. When either horizontal scan loss or vertical deflection loss occurs, a voltage SWEEP-LOSS, that is close to zero volts, is developed at terminal 70a. During normal operation, voltage SWEEP-LOSS is at approximately +12 volts.

A low level video signal from antenna or other source 8 is provided by a video processor 9 to a kinescope driver stage 55. Video processor 9 includes, for example, conventional video processing stages of a projection television receiver that receive an input signal from antenna or other source 8. Stage 55 includes a common emitter amplifier transistor 50 arranged in a cascode amplifier configuration with a common base amplifier transistor 51. The video signal produced by processing stages 9 is coupled to the base input of transistor 50. Base voltage for transistor 51 at +12 volts is provided through a resistor 25 from voltage SWEEP-LOSS, during normal deflection operation.

A transistor stage identical to the stage including transistor 51 is provided for each of the three CRT's of the projection television system, as shown, each having their emitters coupled to the collector output of an amplifier stage 50, these connections not being shown in detail.

The output circuit of driver stage 55 includes a series arrangement 29 formed by an inductor L1, a diode D10, an inductor L2, a resistor 27 and a resistor 28. Series arrangement 29 forms a collector load at the collector of transistor 51. A high level amplified video signal is developed at the collector of transistor 51. The output circuit of driver stage 55 also includes opposite conductivity type emitter follower transistors 30 and 81 forming a Class B amplifier with base inputs coupled to the collector of transistor 51 across diode D10. The emitter output of transistor 81 is coupled to the emitter output of transistor 30. The high level amplified video signal is coupled from the emitter output of PNP follower transistor 30 or of NPN follower transistor 81, which corresponds to an output terminal of driver stage 55, to a cathode electrode 56 of image reproducing kinescope or CRT 10 via a kinescope arc current limiting resistor 33 and peaking circuitry comprising resistor 35 and inductor 36. A collector resistor 30a coupled to transistor 30 acts as a kinescope arc current limiting resistor.

Kine supply voltage level $+V_1$ is coupled to a terminal 28a of stage 55, between series arrangement 29 and resistor 34. Voltage level $+V_1$ is coupled to terminal 28a via a resistor R24 that is coupled to a filter capacitor C8 and via a self biasing diode 60. The purpose of diode 60 is also described in copending application Ser. No. 07/516386, entitled A SELF BIASING PROTECTION ARRANGEMENT FOR A CATHODE RAY TUBE, in the name of John Barrett George, filed concurrently herewith and incorporated by reference herein. An arrangement similar to stage 55, not shown, is provided for each of CRT's 11 and 12.

When, for example, a user turns off the power to the television receiver, such as, for example, by disconnecting mains supply voltage 116, deflection loss occurs and voltage SWEEP-LOSS attains a near zero volt level. Voltage SWEEP-LOSS at near zero volts causes transistor 51 to become nonconductive. As long as voltage level $+V_1$ is produced (e.g. from stored charge in the receiver's filter capacitor C4, for example) a cathode voltage $V_K$ of CRT 10 is maintained at approximately $+225$ volts (no video signal is now present). A grid voltage $V_G$ that is developed at a control grid of CRT 10 is maintained at a voltage that is not more positive than $+27$ volts. The large voltage difference between the cathode and grid of CRT 10 causes a cut-off condition to occur in CRT 10 in which a beam current $i_{BEAM}$ at the cathode of CRT 10 becomes near zero. Voltage SWEEP-LOSS at zero volts protects CRT 10 against damage to its display screen even if ultor voltage U is sufficiently large to produce a large beam current. This also occurs should a SWEEP-LOSS occur when the television receiver is still turned on.

Assume that, for example, a fault condition occurs when the power to the television receiver is already turned on, or when the user turns off the power to the television receiver, such that voltage level $+V_1$ becomes substantially smaller than in normal operation such as, for example, zero volts, but ultor voltage U is still at a normal or substantially high level. When, for example, the user turns off the television receiver, horizontal and vertical deflection cease and voltage SWEEP-LOSS becomes near zero, as explained before. Consequently, transistors 51 and 30 become nonconductive.

As explained in the above copending application, U.S. Ser. No. 07/516386, diode 60 becomes back biased when voltage level $+V_1$ is substantially smaller than in normal operation and prevents beam current $i_{BEAM}$ from flowing to ground via, for example, capacitor C4 in the supply at terminal 32 (see FIG. 1a). Therefore, beam or cathode current $i_{BEAM}$ charges a cathode electrode capacitance Cp, formed at the cathode of CRT 10, to develop cathode voltage $V_K$ at a large magnitude in a self biasing manner. Voltage $V_K$ causes CRT 10 to be, advantageously, substantially in cut-off. The result is that beam current $i_{BEAM}$ becomes close to zero in a negative feedback manner. Advantageously, the cathode voltage of CRT 10 can increase quickly because of the small value of cathode electrode capacitance Cp that is in the order of 15 picofarads. Thus, diode 60 produces a high output impedance of video driver stage 55 at the cathode electrode of CRT 10 relative to ground. The high output impedance that is determined by capacitance Cp provides self bias to CRT 10 that tends to cut-off beam current $i_{BEAM}$.

Had capacitors C4 and C8 not been coupled to terminal 28a of stage 55 through a switch such as diode 60, a significant drop in voltage level $+V_1$ might have caused beam current $i_{BEAM}$ to flow to ground. Current $i_{BEAM}$ could flow through a main current path that includes an emitter-base P-N junction of transistor 81, because of an avalanche or breakdown condition in such P-N junction, and through capacitors C4 and C8, for example, or through any other supply load that is coupled to terminal 32 of capacitor C4. Therefore, the cathode voltage of CRT 10 would have been too small to provide blanking of beam current $i_{BEAM}$. Therefore, a small cathode-grid voltage difference would have been formed in CRT 10 (not taking into account the operation of the protection circuit according to the invention embodied in circuit 777 to be described below). The small cathode-grid voltage difference in CRT 10 would have produced beam current $i_{BEAM}$ that would have caused damage to the screen of CRT 10, when deflection loss occurs. Due to the small value of capacitance Cp, the response time for producing the cut-off condition in CRT 10 is, advantageously, short.

A grid biasing and cut-off circuit 777 is provided for additional CRT protection, providing redundancy to the SWEEP-LOSS signal and the circuit including self bias diode 60. Circuit 777 maintains grid voltage $V_G$ at about $+27$ volts during normal operation and causes voltage $V_G$ to be at about $-200$ volts when signal HOR that is indicative of normal horizontal deflection is not generated. Under various fault conditions circuit 777 provides additional protection that is capable of blanking CRT 10.

As explained above, circuitry for protecting the CRT screen during scan loss is especially important in projection television receivers because of their high density beam currents. The circuitry for addressing the problem of CRT screen damage should be redundant such that no one component failure causes the CRT screen to be burned.

There are, however, situations wherein it is important to have additional protection for the CRT screen in the event of a scan loss. For example, when, due to a fault condition, voltage SWEEP-LOSS is not generated at close to zero volts when vertical scan loss occurs. Also, in a situation where a scan loss occurs when one of the video amplifiers, for example one of transistors 51, develops a collector-to-emitter short, the cathode of the CRT may be forced very close to ground, thus producing a beam current at the critical time when deflection loss has occurred. Deflection loss occurs as a result of, for example, the user's turning-off the television receiver.

A circuit 777 of FIG. 1b having an input coupled from the horizontal deflection stage shown in FIG. 1a and coupled to the supply voltage $+V_1$ and further having an output coupled to the control grid of the CRT is provided. In particular, a circuit 777 is provided for each of the three CRT's of the projection television receiver, each having their inputs coupled to the signal HOR and being coupled to the supply voltage $+V_1$ and having an output coupled to the respective CRT grid. The circuit 777 provides a degree of redundancy in those situations in which the SWEEP-LOSS signal might not be adequate to protect the CRT screens when an additional component failure, for example, a video amplifier short, has occurred, in addition to the loss of sweep during receiver turn-off.

Although the circuit according to the invention is shown used in a projection type television receiver having three CRT's, it is, of course, equally applicable in a receiver having only one CRT where high beam currents can cause phosphor damage or deflection loss.

With reference to FIG. 1b, the signal HOR from the horizontal deflection stage shown in FIG. 1a, and which is indicative of normal horizontal deflection operation, is supplied to resistor 100 and series coupled capacitor 102. Signal HOR typically ranges between $-5$ volts and $+25$ volts, with $+25$ volt peaks occurring during the horizontal retrace interval and approximately a $-5$ volt level during the horizontal trace interval. Capacitor 102 serves as a DC blocking AC coupling capacitor for signal HOR and isolates signal HOR from the 225 volts, voltage level $+V_1$. The resistor 100 is a current limiting resistor to control the large currents that may occur when the 225 volt supply and line HOR have about 2000 volts between them during a kinescope arc. Line HOR is also utilized as the heater supply for the CRT filaments. Capacitor 102 is a coupling capacitor that shifts the DC component from ground level to about 200 volts, as shown by the waveform at the anode of diode 104. Diode 104 serves as a rectifier and peak clamper.

The active component of the deflection loss protection circuit, which may also be referred to as a "grid kicker" circuit, comprises a PNP transistor 106 whose base-emitter junction is biased on during the negative portion of the signal HOR at the junction of capacitor 102 and a resistor 108. Resistor 108 limits the base current to transistor 106. During the transistor on-time, current also flows from the 225 volt supply of voltage level $+V_1$ through resistor R24 through the emitter-collector junction of transistor 106. A capacitor 110 is charged, advantageously, over only several cycles through transistor 106, zener diode 112, diode 114 and resistor 116. Zener diode 112 clamps the voltage at the CRT grid, in the embodiment shown, to approximately 27 volts maximum during the charging process. After several cycles of signal HOR, the voltage across capacitor 110 obtains a value near 200 volts and the collector voltage of transistor 106 is at $+225$ volts, approximately. At this point in time, zener diode 112 ceases conduction because the voltage divider comprising resistors 118 and 120 (resistor 116 can be ignored for purposes of the calculation) is selected to provide approximately 25 volts to the CRT grid, an amount less than the zener value of 27 volts. This is done to prevent noise generation in the zener diode during normal receiver operation. The transistor 106 is now saturated so that a collector to emitter voltage of about 0.5 volts is established. A capacitor 122, embodying an aspect of the invention, is provided between the collector and base junction of transistor 106 as a positive feedback Miller device that slows the transistor turn-off by AC coupling the base tightly to the collector. If the collector voltage attempts to decrease, the base is turned on harder preventing the decrease. Capacitor 122 thus prevents transistor 106 from turning off during the positive portion of the HOR waveform but allows transistor 106 to turn off quickly if the HOR waveform is not present.

When transistor 106 turns off, for example, when signal HOR disappears, indicating the loss of horizontal scan, the collector voltage is pulled to ground by resistor 124. Capacitor 110 still has approximately 200 volts across it. The voltage at the CRT grid and the anode of diode 114 tracks the 225 volt change at the collector of transistor 106 and lowers from approximately $+25$ volts to about $-200$ volts. Diode 114 is now reversed biased. The CRT grid then gradually increases toward ground at a time constant, in the preferred embodiment, of about 12.7 seconds determined substantially by resistor 120 and capacitor 110. Meanwhile, advantageously, no current is drawn from 225 volt supply of voltage level $+V_1$ because transistor 106 and the transistors 51 are turned off. The signal SWEEP-LOSS has become approximately zero volts due to the loss of horizontal deflection and there is no current path from the 225 volt supply of voltage level $+V_1$ to ground now that transistor 106 is also nonconductive. This condition normally, advantageously, maintains the 225 volt supply on the cathode of the CRT until the filter capacitor C4 of the 225 volt supply discharges from stray leakage, approximately several seconds. Resistor 116 limits the current in zener diode 112 and diode 114 during kinescope arcs. Capacitor 126 is a video bypass between the CRT cathode circuit and the grid. The combination of capacitor 126, capacitor 110 and capacitor 122 bypass kine arc currents around transistor 106 and protect it from damage.

During a scan loss, the scan loss detectors shown in FIG. 1a will provide a SWEEP-LOSS signal of approximately zero volts when either vertical or horizontal scan loss is detected, as explained before. Transistors 51 normally operate with small base currents and with a base voltage near 12 volts. If a fault such as an open collector occurs in any of the transistors 51, the additional current drawn into the base of the bad transistor will lower the bias to the other two amplifiers and turn them off. Capacitor C10 between the scan loss line and the 12 volt supply is a video bypass for the three grounded base upper cascode amplifiers comprising transistors 51.

In the event that a fault occurs in, for example, the cathode circuitry of any of the CRT's during or prior to a sweep-loss, and in particular, a horizontal sweep-loss, the circuit 777 provides an additional degree of protection. In the event, for example, transistor 51 develops an emitter-collector short, the collector of transistor 51 will approach ground level, thus driving transistor 30 on and providing a low voltage at the cathode of the CRT. With a grid voltage of approximately 25 volts and a cathode voltage near ground, a high beam current will be developed. Due to the loss of horizontal sweep, during the receiver turn-off period, a vertical line may be developed near the center of the CRT screen, causing a burned phosphor, if the circuit 777 were not provided. Circuit 777, however, prevents any damage to the CRT screen, because as soon as horizontal deflection ceases, signal HOR ceases to be provided to the base of transistor 106. The loss of signal HOR turns transistor 106 off, and couples the positively charged terminal of capacitor 110 to ground through resistor 124. Accordingly, the negatively charged terminal of capacitor 110, which is coupled to the CRT grid through resistor 128, approaches approximately $-200$ volts with respect to ground. Prior to horizontal sweep-loss, the negative terminal of capacitor 110 had been at approximately $+25$ volts with respect to ground. Accordingly, the grid of the CRT is biased sufficiently negatively to cut off the CRT and prevent any beam current from flowing, therefore protecting the CRT phosphor from any damage.

The CRT protection circuit 777 is advantageous in a number of respects. The use of PNP transistor 106 means that the transistor is turned off when horizontal deflection loss occurs, meaning that the charge on capacitor 110 can be maintained for a relatively long period of time depending upon the value of resistor 120. In the embodiment shown, the time constant is approximately 12.7 seconds and at one R-C time constant, the grid is still maintained at about $-80$ volts.

PNP transistor 106 is off during the time that capacitor 110 is maintains the grid at a substantially negative voltage. Therefore, advantageously, there is very little load on the 225 volt supply of voltage level $+V_1$ during the time that the grid is maintained at a substantially negative voltage. If only a horizontal deflection loss occurs, without a fault in the cathode circuitry, the transistor 106 is turned off as well as the transistors 51 in the video amplifier circuitry due to the loss of sweep. There is no path to ground for the 225 volt supply which makes the 225 volt supply discharge time constant several seconds.

The protection circuit 777 is simple in design, having only one active device, transistor 106. No other active devices are necessary, and the circuit need only be coupled to one supply voltage, the 225 volt supply of voltage level $+V_1$ and does not require any other low voltage supplies in order to operate since it is controlled directly by signal HOR.

The use of Miller capacitance 122 simplifies the horizontal pulse detection. Capacitor 122 is used to keep transistor 106 in saturation during the retrace pulse portion of the horizontal waveform HOR. The non-Miller RC product of capacitor 122 and resistor 124 is approximately 1.6 microseconds. The transistor current gain, or $\beta$, of transistor 106 exceeds 50, giving a minimum Miller time constant of 280 microseconds, in the embodiment shown. This gives less than 1/100 time constant of collector voltage sag during retrace and a PNP turn-off time of less than 10 horizontal lines when horizontal sweep is lost. Accordingly, the use of Miller capacitance 122 simplifies the task of sensing the presence of signal HOR and at the same time, allows rapid determination that signal HOR is not present, providing rapid blanking of the CRT screen through grid control.

Three circuits 777 are provided. Only one such circuit is shown for one CRT, but a circuit is provided for each of the grids of the other two CRT's 11 and 12, as would be evident to a person of skill in the art.

Another advantage of the protection circuit 777 is that it allows the grid to be maintained at approximately +25 volts during normal operation with respect to ground. Therefore, maximum beam current can be produced without saturating transistor 51. Maximum beam current in a CRT can be produced when the grid voltage level is allowed to approach the cathode voltage level. A more detailed explanation of why biasing the grid voltage at +25 volts is desirable is described in detail in a copending U.S. patent application Ser. No. 07/515,512 in the names of Gurley et al., entitled VIDEO DISPLAY APPARATUS WITH KINESCOPE SPOT BURN PROTECTION CIRCUIT, filed concurrently herewith and incorporated by reference herein.

It is important in order to prevent CRT damage, that the grid be able to be switched quickly to a high negative voltage in order to cut off beam current in the event of deflection loss. This is achieved in circuit 777 by the zener diode 112 and diode 114 as well as resistors 118 and 120 providing a voltage divider circuit. During initial charging of capacitor 110 through transistor 106, the zener diode 112 is initially conductive, develops a voltage across resistor 118 of approximately +27 volts and allows capacitor 110 to charge quickly. Once the capacitor has charged, however, the zener diode becomes nonconductive because of the selection of the relative values of resistors 118 and 120 of the voltage divider (approximately 25 volts across resistor 118), and the stored charge on capacitor 110 is placed substantially across resistor 120 having a relatively high resistance. When horizontal sweep-loss occurs, within a few cycles of the lost horizontal sweep signal, transistor 106 turns off and the charge stored on capacitor 110 is placed on the grid of the CRT thereby blanking the CRT screen.

In accordance with an aspect of the invention, circuit 777 utilizes only the horizontal deflection signal HOR as an input signal instead of the SWEEP-LOSS signal from the scan loss detection circuit; whereas, the SWEEP-LOSS signal that is produced when either horizontal or vertical scan loss occurs causes transistor 51 of the video amplifier to be disabled when either horizontal or vertical scan loss occurs. In addition to providing a degree of redundancy, this is also important in a situation where a fault occurs in both the video amplifier circuitry and the vertical deflection circuitry.

Assume that a vertical deflection loss occurs, and one of the video amplifier transistors 51 shorts. As explained before, beam current can flow, in the absence of circuit 777, to ground through the cathode circuitry, including the failed transistor 51. Should a vertical sweep-loss occur, the faulty transistor 51 will allow beam current to flow to ground. Thus, because transistor 51 is defective signal SWEEP-LOSS cannot cause beam current blanking. If a circuit similar to circuit 777 was provided to develop a sufficiently large negative voltage at the grid of the CRT when vertical scan loss occurred, and such circuit operated from a signal similar to the SWEEP-LOSS signal developed in the circuit of FIG. 1a that is generated when either loss of vertical or loss of horizontal deflection occurs (instead of only from the signal HOR), and if a capacitor similar to capacitor 110 was charged in order to develop this sufficiently large negative voltage, then the charge on the capacitor would dissipate after a short interval of several time constants. This is so because loss of vertical deflection would have caused the capacitor to discharge. Therefore, the horizontal line would appear on the CRT screen after several time constants. When, subsequently, a user turns off the television receiver (typically a horizontal line does not cause phosphor burn as rapidly as a vertical line or spot), and then the horizontal sweep disappears, because the capacitor that is similar to capacitor 110 is already discharged, a negative voltage at the control grid can no longer be generated. Therefore, a beam spot will be formed at the center of the screen for a brief instant in time, which is often enough to cause CRT phosphor damage at the spot.

In accordance with a feature of the invention, the horizontal sweep signal HOR is used instead as a signal such as the SWEEP-LOSS signal as the input to the circuit 777. Should a vertical sweep-loss occur at the same time that one of the video amplifier transistors is shorted, the CRT screen would collapse to a horizontal line, since horizontal sweep is assumed to be maintained. When the user turns off the television receiver, because of, for example, noticing the defect, loss of horizontal deflection signal HOR will turn off transistor 106, placing the negative voltage on capacitor 110 on the grid of the CRT, preventing beam current flow and therefore preventing a spot from appearing at the center of the CRT screen, despite the fact that the horizontal field has collapsed.

What is claimed is:
1. A video display apparatus, comprising:
 a cathode ray tube having a cathode electrode, a control grid electrode and a high voltage electrode;
 a source of a high voltage coupled to said high voltage electrode of said cathode ray tube for produc- ing a beam current that flows in said cathode electrode;

means for generating a horizontal deflection current in a horizontal deflection winding;

means for generating a vertical deflection current in a vertical deflection winding;

means coupled to said horizontal deflection current generating means for generating a first signal that is indicative of said horizontal deflection current being in normal operation and of a fault condition in said horizontal deflection current when a fault condition in said vertical deflection current occurs;

means coupled to said vertical deflection current generating means for generating a second signal that is indicative of said vertical deflection current being in normal operation and of a fault condition in said vertical deflection current when a fault condition in said horizontal deflection current occurs;

a video amplifier responsive to said first and second signals and coupled to said cathode electrode for generating a cathode electrode voltage at said cathode electrode such that when both deflection currents are in normal operation said video amplifier operates in a normal mode of operation and when a fault condition occurs in any one of said deflection currents said video amplifier generates said cathode voltage at a level that provides protection against display screen damage; and means responsive to said first signal and coupled to said grid electrode for generating a grid electrode voltage at said grid electrode such that as long as said first signal is indicative of said horizontal deflection current being in normal operation, even if said fault condition in said vertical deflection current occurs, said grid electrode voltage generating means generates said grid voltage in a normal mode of operation level and, after said first signal becomes indicative of the occurrence of a fault in said horizontal deflection current, said grid electrode voltage generating means generates said grid voltage at a second level that provides protection against said display screen damage.

2. An apparatus according to claim 1 wherein when said fault condition occurs in any of said deflection currents, said cathode electrode voltage provides beam current blanking.

3. An apparatus according to claim 1 wherein when said fault condition occurs in said horizontal deflection current, said grid electrode voltage provides beam current blanking.

4. An apparatus according to claim 1 wherein said grid electrode voltage generating means comprises a capacitor, means for developing a voltage across said capacitor in normal mode operation of said grid electrode voltage generating means and means responsive to said first signal for applying said voltage across said capacitor to said grid electrode when said fault condition in said horizontal deflection current occurs to generate said grid electrode voltage at said second level that provides fault protection.

5. An apparatus according to claim 4 wherein, after a first interval that follows the occurrence of said fault condition in said horizontal deflection circuit has elapsed, said capacitor is discharged.

6. An apparatus according to claim 5 wherein said capacitor voltage is developed across said capacitor as long as said first signal is indicative of normal operation.

7. An apparatus according to claim 5 wherein after said first interval has elapsed said capacitor is incapable of providing beam current blanking and wherein, as long as said first signal is indicative of said horizontal deflection current being in normal operation, said capacitor is in a ready state to provide the beam current blanking regardless of said second signal.

* * * * *